(12) United States Patent
Chen et al.

(10) Patent No.: US 9,269,677 B2
(45) Date of Patent: Feb. 23, 2016

(54) FABRICATION METHOD OF PACKAGING SUBSTRATE

(71) Applicant: Siliconware Precision Industries Co., Ltd., Taichung (TW)

(72) Inventors: Chia-Yin Chen, Taichung (TW); Yu-Ching Liu, Taichung (TW); Yueh-Chiung Chang, Taichung (TW); Yu-Po Wang, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 14/531,226

(22) Filed: Nov. 3, 2014

(65) Prior Publication Data

US 2015/0050782 A1 Feb. 19, 2015

Related U.S. Application Data

(62) Division of application No. 13/490,810, filed on Jun. 7, 2012, now Pat. No. 8,901,729.

(30) Foreign Application Priority Data

Dec. 21, 2011 (TW) .............................. 100147660 A

(51) Int. Cl.
*H01L 23/00* (2006.01)

(52) U.S. Cl.
CPC ................ *H01L 24/03* (2013.01); *H01L 24/27* (2013.01); *H01L 24/83* (2013.01); *H01L 2224/0381* (2013.01); *H01L 2224/03462* (2013.01); *H01L 2224/03552* (2013.01); *H01L 2224/03831* (2013.01); *H01L 2224/04042* (2013.01); *H01L 2224/8385* (2013.01); *H01L 2924/01028* (2013.01); *H01L 2924/01029* (2013.01); *H01L 2924/01079* (2013.01)

(58) Field of Classification Search
CPC .......................... H01L 23/50; H01L 23/49838
USPC ......... 257/690, 692, 693, 695, 773, 786, 784, 257/290, 392
See application file for complete search history.

(56) References Cited

U.S. PATENT DOCUMENTS

| 5,126,821 A * | 6/1992 | Okinaga et al. ............... 257/784 |
| 6,800,944 B2 * | 10/2004 | Buschbom .................... 257/778 |
| 2013/0161837 A1 | 6/2013 | Chen et al. |

FOREIGN PATENT DOCUMENTS

TW            I223426         11/2004

* cited by examiner

*Primary Examiner* — Yu-Hsi D Sun
(74) *Attorney, Agent, or Firm* — Mintz Levin Cohn Ferris Glovsky and Popeo, P.C.; Peter F. Corless; Steven M. Jensen

(57) ABSTRACT

A packaging substrate and a semiconductor package using the packaging substrate are provided. The packaging substrate includes: a substrate body having a die attach area, a circuit layer formed around the die attach area and having a plurality of conductive traces each having a wire bonding pad, and a surface treatment layer formed on the wire bonding pads. Therein, only one of the conductive traces is connected to an electroplating line so as to prevent cross-talk that otherwise occurs between conductive traces due to too many electroplating lines in the prior art.

9 Claims, 5 Drawing Sheets

FABRICATION METHOD OF PACKAGING SUBSTRATE

CROSS-REFERENCE TO RELATED APPLICATIONS

This application is a divisional of application U.S. Ser. No. 13/490,810, filed on Jun. 7, 2012, which claims under 35 U.S.C. §119(a) the benefit of Taiwanese Application No, 100147660, filed Dec. 21, 2011, the entire contents of which are incorporated herein by reference.

BACKGROUND OF THE INVENTION

1. Field of the Invention

The present invention relates to semiconductor packages, packaging substrates and fabrication methods thereof, and, more particularly, to a wire-bonding semiconductor package, packaging substrate and fabrication method thereof.

2. Description of Related Art

For electrically connecting a semiconductor chip and a packaging substrate or a lead frame through bonding wires, the semiconductor chip has a plurality of electrode pads formed on a surface thereof and the packaging substrate has a plurality of wire bonding pads corresponding to the electrode pads, or the lead frame has a plurality of leads corresponding to the electrode pads. The semiconductor chip is mounted on a die attach area of the packaging substrate or the lead frame and the electrode pads of the semiconductor chip are electrically connected to the wire bonding pads or the leads through a plurality of bonding wires such that the semiconductor chip is electrically connected to the packaging substrate or the lead frame.

Generally, before a wire bonding process, a surface treatment layer made of, for example, Ni/Au is formed on the wire bonding pads of the packaging substrate for improving electrical bonding forces between gold wires and the wire bonding pads and avoiding oxidation of the wire bonding pads. The process for forming the surface treatment layer can be a process with plating lines or a process without plating lines.

FIGS. 1A and 1A' show a conventional electroplating process with plating lines. Referring to the drawings, a substrate body 10 has a die attach area A and a circuit layer 11. The circuit layer 11 has a plurality of conductive traces 11a and a plurality of conductive vias 11b. One end of each of the conductive traces 11a has a wire bonding pad 110 disposed adjacent to the die attach area A, and the other end is disposed away from the die attach area A for connecting a corresponding one of the conductive vias 11b and further connecting an electroplating line 111 extending to an edge of the substrate body 10. Further, the electroplating lines 111 at each side of the substrate body 10 are connected to an electroplating bus (or referred to as a common electroplating line, not shown). An insulating protection layer 12 is formed on the substrate body 10, and a plurality of openings 120 are formed in the insulating protection layer 12 for exposing the wire bonding pads 110.

Then, a plurality of array-arranged substrate bodies 10 are disposed in an electroplating tub (not shown) and an electroplating process is performed such that current flows through the electroplating buses as well as the electroplating lines 111 to thereby form a surface treatment layer 14 on the wire bonding pads 110. Then, the electroplating buses are removed.

As described above, each of the conductive traces 11a is connected to an electroplating line 111. After the electroplating process, the electroplating lines 111 still remain on the edges of the substrate body 10. As such, when the packaging substrate 1 is applied to a high frequency product having high electrical performance, signal transmission in the conductive traces 11a can be adversely affected by the electroplating lines 111 such that cross-talk occurs, thereby resulting in signal distortion or poor electrical performance.

Accordingly, an NPL (Non-plating line) electroplating process is provided. Referring to Taiwan Patent No. I223426 or FIG. 1B, a conductive film 13 is formed on a substrate body 10' and a first resist layer 12a is formed on the conductive film 13 such that an electroplating process is performed for forming a circuit layer 11'. Then, a second resist layer 12b is formed such that an electroplating process is performed through the conductive film 13 for forming a surface treatment layer 14' on wire bonding pads 110' of the circuit layer 11'. Thereafter, the first resist layer 12a, the second resist layer 12b and the conductive film 13 covered by the first and second resist layers 12a, 12b are removed. By using the conductive film 13 instead of a plurality of electroplating lines, cross-talk is avoidable.

However, in the NPL electroplating process, two patterning processes for patterning the resist layers are required. The resist layers and masks are high in material cost, and exposure and development processes are also high in equipment cost. Therefore, the NPL electroplating process is costly, time-consuming and does not meet cost-effective requirements.

To mount a semiconductor chip 16 on the packaging substrate, an adhesive layer 15 is formed on the insulating protection layer 12 in the die attach area A. Referring to FIG. 1A', when the chip 16 is attached to the adhesive layer 15, the adhesive layer 15 is squeezed to overflow, thus polluting the wire bonding pads 110 around the die attach area A and adversely affecting the electrical connection of the packaging substrate 1.

In order to increase the distance D between the wire bonding pads 110 and the die attach area A so as to protect the wiring bonding pads 110 from being polluted by the adhesive material, the area of the substrate body 10 needs to be increased. As such, the packaging substrate 1 cannot meet the miniaturization requirement. Furthermore, since the layout space for the circuit layer 11 are reduced due to the provision of the electroplating lines, the flexibility of the circuit layout is reduced.

To increase the distance D between the wire bonding pads 110 and the die attach area A, the length of gold wires (not shown) also needs to be increased, thereby leading to a high material cost and a high fabrication cost.

Therefore, how to overcome the above-described drawbacks has become urgent.

SUMMARY OF THE INVENTION

In view of the above-described drawbacks, an object of the present invention is to provide a semiconductor package, a packaging substrate and a fabrication method thereof so as to prevent cross-talk from occurring.

Another object of the present invention is to provide a semiconductor package, a packaging substrate and a fabrication method thereof so as to reduce the fabrication cost, improve the circuit layout flexibility and meet the miniaturization requirement.

The semiconductor package of the present invention comprises: a substrate body having a die attach area; a circuit layer formed on the substrate body and having a plurality of conductive traces each having a first end positioned adjacent to the die attach area and an opposing second end positioned away from the die attach area, wherein each of the first ends has a wire bonding pad, the second end of at least one of the conductive traces at at least one side of the die attach area is connected to an electroplating line, and the electroplating lines and the wire bonding pads at the same side of the die attach area are different in number; a surface treatment layer formed on the wire bonding pads; and a semiconductor chip mounted on the die attach area through an adhesive layer and electrically connected to the wire bonding pads through a plurality of bonding wires.

The packaging substrate of the present invention comprises: a substrate body having a die attach area; a circuit layer formed on the substrate body and having a plurality of conductive traces each having a first end positioned adjacent to the die attach area and an opposing second end positioned away from the die attach area, wherein each of the first ends has a wire bonding pad, the second end of at least one of the conductive traces at at least one side of the die attach area is connected to an electroplating line, and the electroplating lines and the wire bonding pads at the same side of the die attach area are different in number; and a surface treatment layer disposed on the wire bonding pads.

The fabrication method of the packaging substrate comprises the steps of: providing a substrate body having a die attach area and a circuit layer formed around the die attach area, wherein the circuit layer has a plurality of conductive traces each having a first end positioned adjacent to the die attach area and an opposing second end positioned away from the die attach area, each of the first ends has a wire bonding pad, the second end of at least one of the conductive traces at least one side of the die attach area is connected to an electroplating line, and the electroplating lines and the wire bonding pads at the same side of the die attach area are different in number; forming a conductive layer at an edge of the die attach area between the die attach area and the circuit layer, and electrically connecting the conductive layer to the conductive traces; performing an electroplating process through the conductive layer and the electroplating line so as to form a surface treatment layer on the wire bonding pads; and removing the conductive layer.

In the above-described method, the conductive layer can be removed by laser, a chemical solution or a scraper.

In the above-described method, each of the wire bonding pads is connected to an extending line so as to be connected to the conductive layer.

In the above-described substrate and method, an adhesive layer can be formed on the die attach area such that a semiconductor chip is mounted on the die attach area through the adhesive layer and electrically connected to the wire bonding pads through a plurality of bonding wires.

In the above-described package, substrate and method, the electroplating lines can be less in number than the wire bonding pads at the same side of the die attach area. For example, only one of the conductive traces is connected to the electroplating line through the second end thereof.

When removing the conductive layer, the above-described method can further comprise forming a recess corresponding in position to the conductive layer such that the recess is formed between the die attach area and the circuit layer and each of the wire bonding pads is connected to an extending line so as to be in connection with the recess.

In the above-described package, substrate and method, a ground portion can be formed on the substrate body.

After forming the conductive layer and before forming the surface treatment layer, the method can further comprise forming an insulating protection layer on the substrate body and the circuit layer and forming a plurality of openings in the insulating protection layer for exposing the wire bonding pads.

According to the present invention, since the conductive layer electrically connects all the conductive traces, only one of the conductive traces needs to be connected to an electroplating line for forming a surface treatment layer on the wire bonding pads. As such, only one electroplating line exists on the substrate body after the fabrication process, which prevents signal transmission in the conductive traces from being adversely affected by adjacent electroplating lines as in the prior art so as to avoid cross-talk, thereby overcoming the conventional problem of signal distortion or poor performance.

Further, when the semiconductor chip is mounted on the die attach area through the adhesive layer, the adhesive layer is squeezed to overflow into the recess. Therefore, the wire bonding pads are protected from being polluted by the adhesive material so as to ensure the wire bonding quality and the electrical reliability.

Furthermore, by forming the recess, the present invention eliminates the need to increase the distance between the wire bonding pads and the die attach area. As such, the packaging substrate can meet the miniaturization requirement. Also, since only a small number of electroplating lines is required in the present invention, the circuit layout space and flexibility are increased. Moreover, the present invention eliminates the need to increase the length of gold wires, thereby reducing the material cost and the fabrication cost.

BRIEF DESCRIPTION OF DRAWINGS

FIG. 1A' is a schematic cross-sectional view of a conventional packaging substrate and a semiconductor chip;

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modification and variations can be made without departing from the spirit of the present invention. Further, terms such as "one", "on", "first", "second" etc. are merely for illustrative purpose and should not be construed to limit the scope of the present invention.

FIGS. 2A to 2E are schematic cross-sectional views showing a fabrication method of a packaging substrate according to the present invention.

Figure 1A:
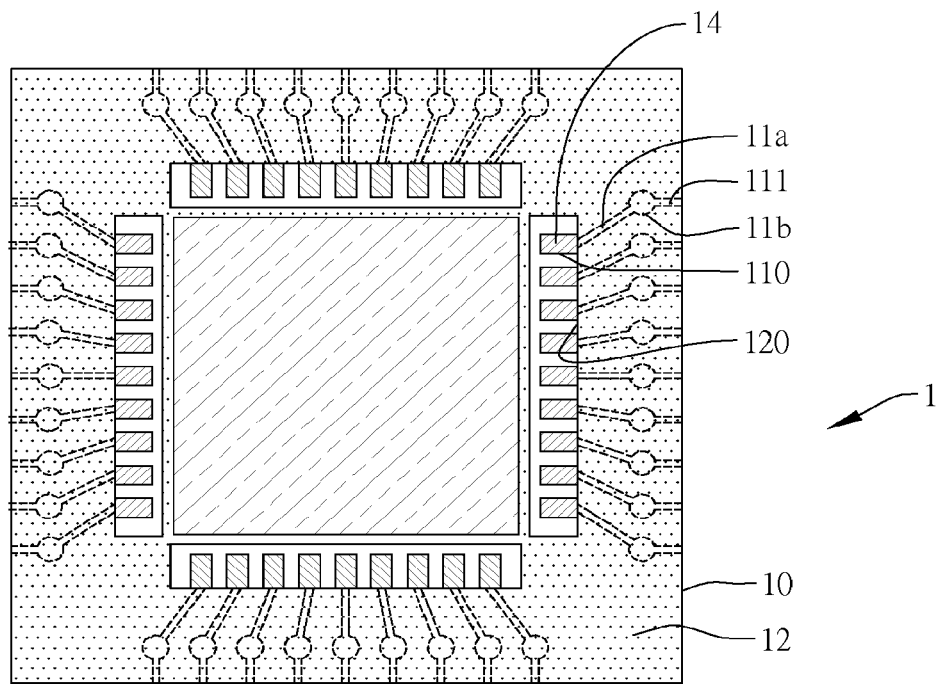
FIG. 1A is a schematic upper view of a conventional packaging substrate.
Figure 1A:
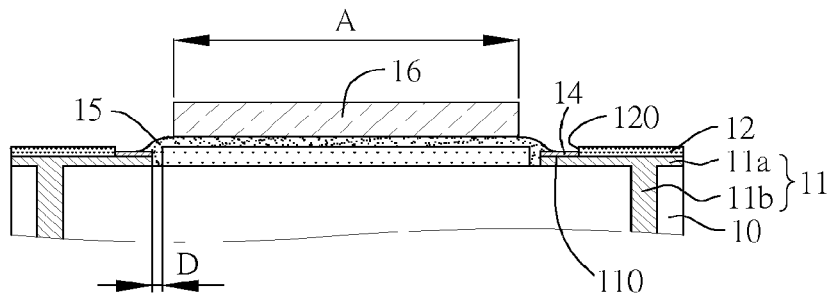
Figure 1B:
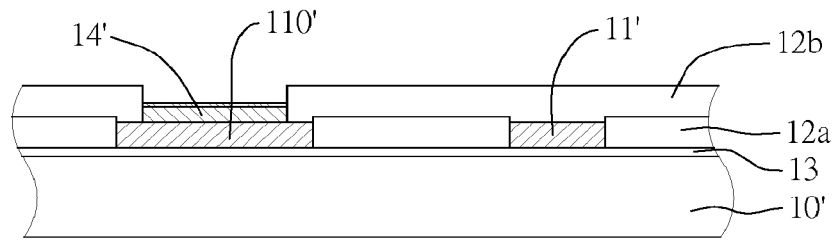
FIG. 1B is a schematic cross-sectional view showing a fabrication method of another conventional packaging substrate.
Figure 2A:
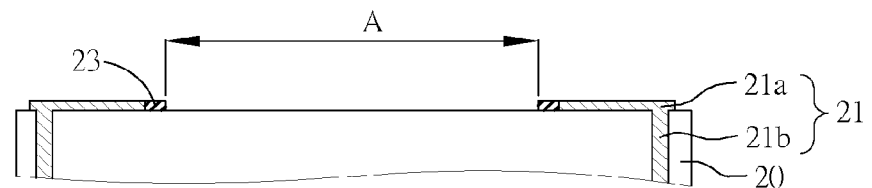
FIGS. 2A to 2D are schematic cross-sectional views showing a fabrication method of a packaging substrate according to the present invention, wherein FIGS. 2A' and 2B' are schematic upper views of FIGS. 2A and 2B, respectively.
Figure 2A:
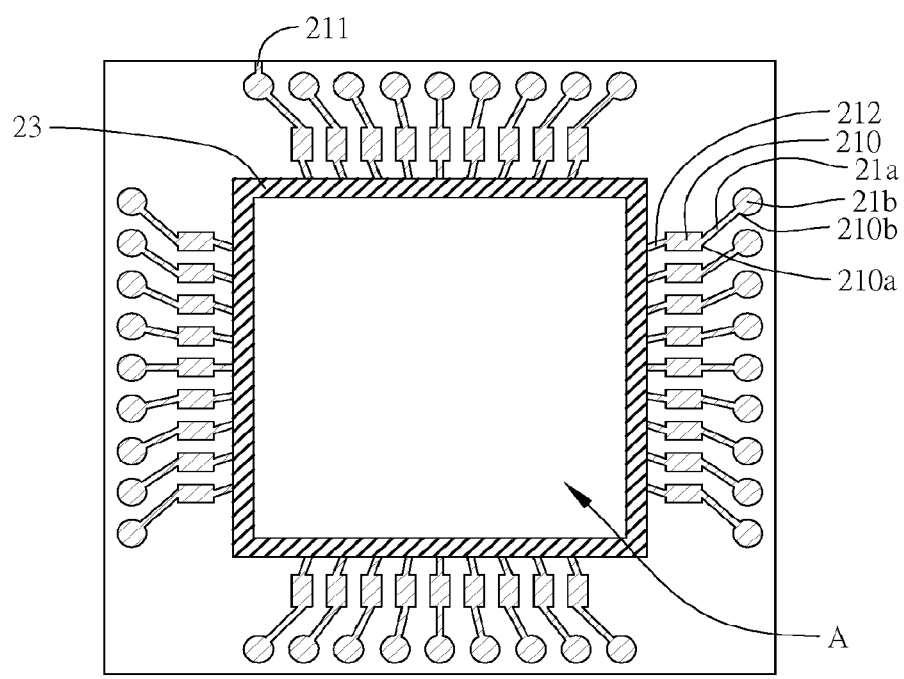

Referring to FIGS. 2A and 2A', a substrate body 20 is provided. The substrate body 20 has a die attach area A, a circuit layer 21 formed around the die attach area A, and a conductive layer 23 formed between the die attach area A and the circuit layer 21.

The circuit layer 21 has a plurality of conductive traces 21a and a plurality of conductive vias 21b. Each of the conductive traces 21a has a first end 210a disposed adjacent to the die attach area A and a second end 210b disposed away from the die attach area A. The first end 210a has a wire bonding pad 210 connected to an extending line 212. The second end 210b is connected to a corresponding one of the conductive vias 21b. Further, an electroplating line 211 is formed to connect the second end 210b of only one of the conductive traces 21a at only one side of the die attach area A. For example, the electroplating line 211 is formed at an upper side of the die attach area A as shown in FIG. 2A'.

Referring to FIG. 2A', only one electroplating line 211 is provided. But it should be noted that the number of the electroplating lines is not limited thereto. The number of the electroplating lines can be determined according to the requirement of a subsequent electroplating process.

The conductive layer 23 electrically connects the extending lines 212 of the conductive traces 21a so as to serve as a current conductive path for electroplating a metal material. The conductive layer 23 can be made of electroplated copper, metal, alloy or several deposited metal layers, or a conductive polymer material. The conductive layer 23 can have a ring shape as shown in FIG. 2A' or consist of a plurality of strips (not shown) corresponding to each side of the die attach area A. There is no special limitation on the shape of the conductive layer 23. It is only required that a plurality of conductive traces are connected to a single conductive layer. For example, a plurality of conductive traces at one side of the die attach area are connected to a single conductive layer. Preferably, the conductive layer 23 is formed in the same electroplating process for forming the conductive traces so as to save time and cost.

In other embodiments, the wire bonding pads 210 of the conductive traces 21a can be directly connected to the conductive layer 23 instead of through the extending lines 212.

Figure 2B:
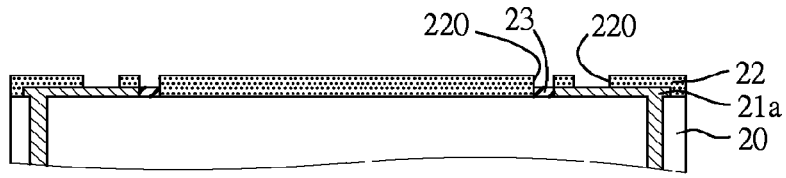
Figure 2B:
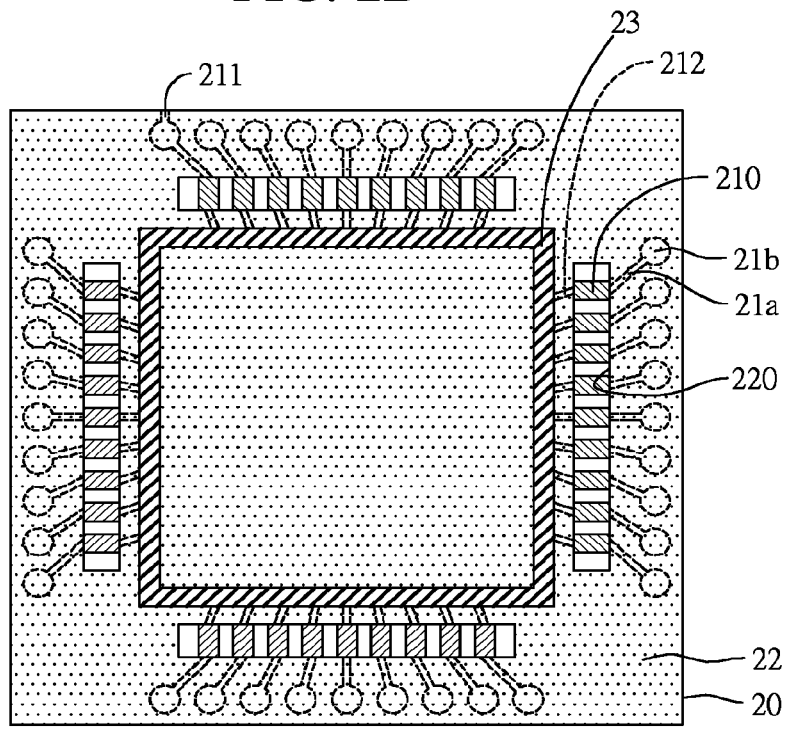

Referring to FIGS. 2B and 2B', an insulating protection layer 22 is formed on the substrate body 20 and the circuit layer 21 and a plurality of openings 220 are formed in the insulating protection layer 22 for exposing the wire bonding pads 210 and the conductive layer 23. Alternatively, only the wire bonding pads 210 are exposed through the openings 220 and the conductive layer 23 is covered by the insulating protection layer 22.

Figure 2C:
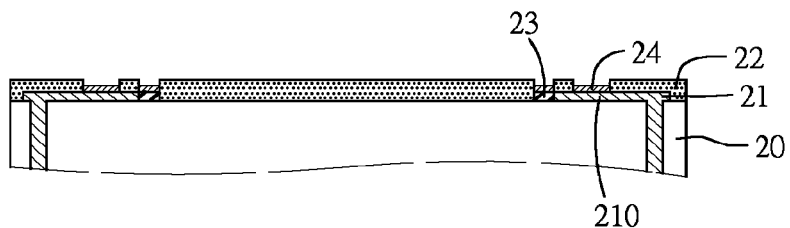

Referring to FIG. 2C, the electroplating lines 211 of the substrate body 20 are connected to an electroplating bus (not shown). Then, a plurality of array-arranged substrate bodies 20 are disposed in an electroplating tub (not shown) and an electroplating process is performed such that current flows through electroplating buses and the electroplating lines 211 to the conductive layer 23, thereby forming a surface treatment layer 24 on the wire bonding pads 210. Then, the electroplating buses are removed.

In the present embodiment, the surface treatment layer 24 is made of Ni/Au, ENEPIG (Electroless Ni/Electroless Pd/Immersion Gold) or DIG (direct immersion gold).

If the conductive layer 23 has a ring shape, it needs only one electroplating process, thereby saving processing steps and time. If the conductive layer 23 consists of a plurality of strips at each side of the die attach area A, an electroplating process needs to be performed at each side of the die attach area A, which facilitates inspection and repair processes, thereby improving the product reliability.

Figure 2D:
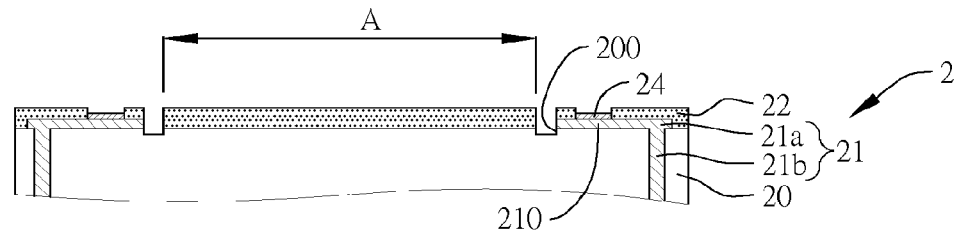

Referring to FIG. 2D, the conductive layer 23 is removed. In the present embodiment, the conductive layer 23 is removed by laser ablation. In other embodiments, the conductive layer 23 can be removed a chemical solution or a scraper.

When the conductive layer 23 is removed, a recess 200 is formed corresponding in position to the conductive layer 23.

Therefore, by forming the conductive layer 23 between the die attach area A and the circuit layer 21 to connect all the conductive traces 21a of the circuit layer 21, the present invention needs only one electroplating line 211 connected to one of the conductive traces 21a at one side of the die attach area A so as to form the surface treatment layer 24 on the wire bonding pads 210 through electroplating. As such, when the packaging substrate of the present invention is applied in a high frequency product having high electrical performance, signal transmission in the conductive traces 21a will not be adversely affected by such a single electroplating line 211, thereby overcoming the conventional problems of cross-talk, signal distortion and poor electrical performance.

Further, the present invention dispenses with the patterning processes in such as an NPL electroplating process, thereby greatly reducing the fabrication cost and shortening the fabrication time.

Figure 2E:
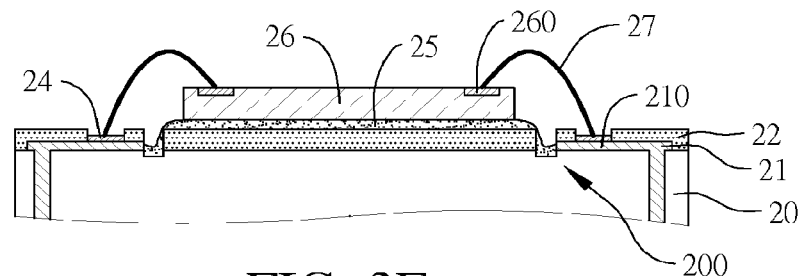
FIG. 2E is a schematic cross-sectional view showing a semiconductor package of the present invention, wherein FIG. 2E' is a schematic upper view of FIG. 2E omitting the bonding wires.
Figure 2E:
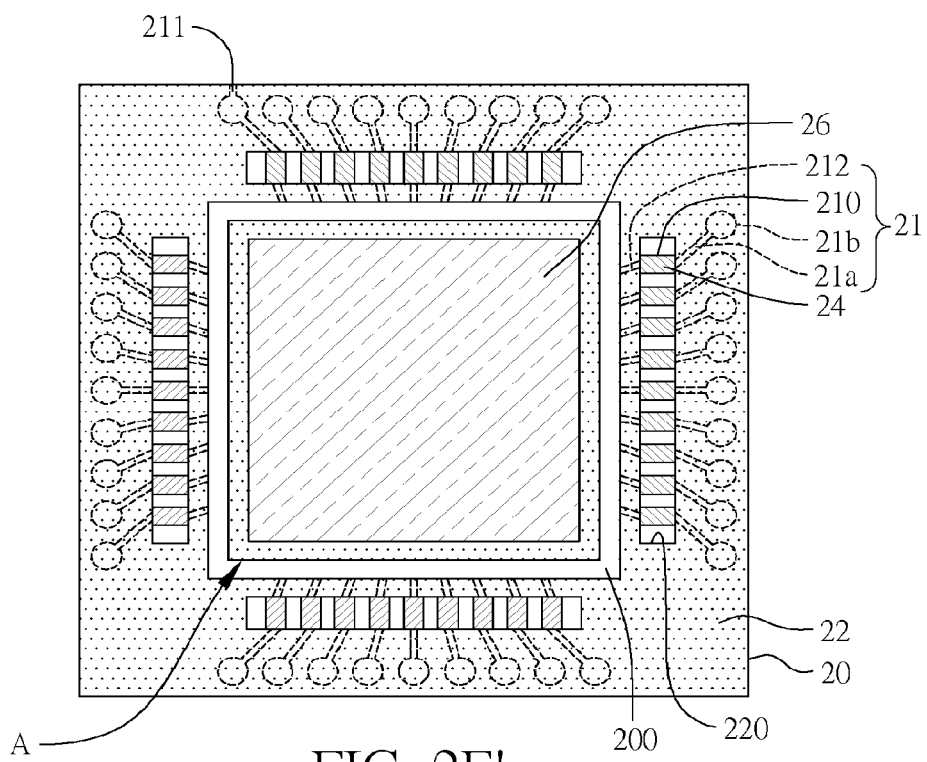

Referring to FIG. 2E, an adhesive layer 25 is formed on the die attach area A so as for a semiconductor chip 26 to be mounted thereon, and a plurality of bonding wires 27 such as gold wires are formed to electrically connect the wire bonding pads 210 and the electrode pads 260 of the semiconductor chip 26. In the present embodiment, the adhesive layer 25 is made of silver paste.

When the semiconductor chip 26 is mounted on the die attach area A through the adhesive layer 25, the adhesive layer 25 is squeezed to overflow to the recess 200, thereby avoiding the conventional problem of pollution of the wire bonding pads 210 by overflowed adhesive material.

Further, by forming the recess 200, the present invention eliminates the need to increase the distance between the wire bonding pads 210 and the die attach area A and hence the area of the substrate body 20 does not need to be increased. Therefore, the packaging substrate 2 can meet the miniaturization requirement. Also, the circuit layout space and flexibility are increased.

Furthermore, the present invention eliminates the need to increase the length of the bonding wires 27, thereby reducing the material cost and the fabrication cost. In another embodiment, referring to FIGS. 3 and 3', when the conductive layer 23 is removed, two ring-shaped recesses 300a, 300b are formed around the die attach area A and used for receiving overflowed adhesive material.

Further, the conductive layer 23 can be partially removed so as to cause the remaining portion of the conductive layer 23 to form a ring-shaped ground portion 31. In the present embodiment, the ground portion 31 is disposed between the circuit layer 21 (the wire bonding pads 210) and the die attach area A. In particular, the ground portion 31 is formed between the two ring-shaped recesses 300a, 300b. It should be noted that there is no special limitation on the shape and position of the ground portion 31.

Figure 3:
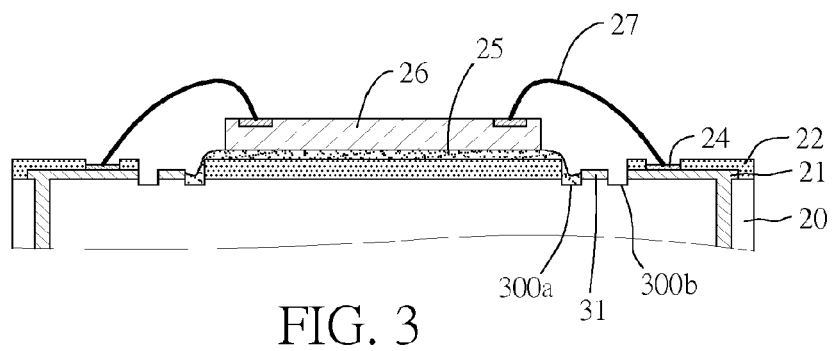
FIG. 3 is a schematic cross-sectional view of a packaging substrate according to another embodiment of the present invention, wherein FIG. 3' is a schematic upper view of FIG. 3.
Figure 3:
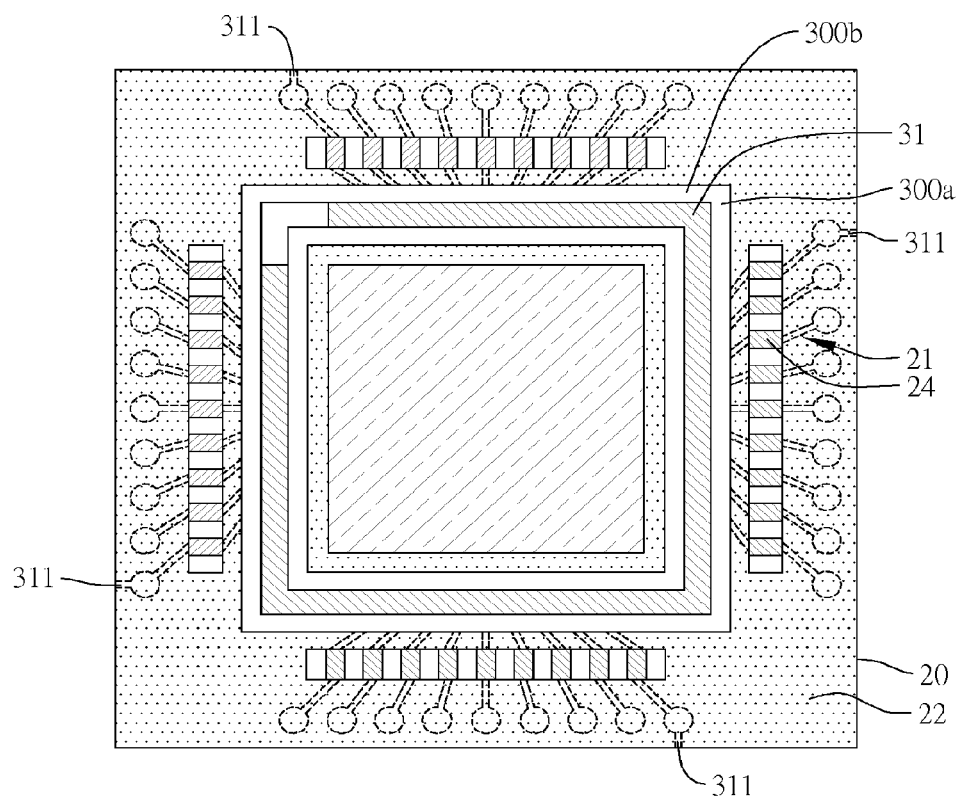

Referring to FIG. 3', each side of the die attach area A can have an electroplating line 311. As such, there are totally four electroplating lines 311.

The present invention further provides a packaging substrate 2, which has a substrate body 20, a circuit layer 21 formed on the substrate body 20 and a surface treatment layer 24 formed on the circuit layer 21.

The substrate body 20 has a die attach area A. A recess 200 can be formed between the die attach area A and the circuit layer 21 according to the practical need.

The circuit layer 21 has a plurality of conductive traces 21a each having a first end 210a disposed adjacent to the die attach area A (or recess 200) and a second end 210b disposed away from the die attach area A (or recess 200). The first end 210a has a wire bonding pad 210 connected to an extending line 212. The extending line 212 is in connection with the recess 200. Only one of the conductive traces 21a at each side of the die attach area A is connected to an electroplating line 211, 311 through the second end 210b thereof.

The surface treatment layer 24 is formed on the wire bonding pads 210.

The packaging substrate 2 further has an adhesive layer 25 formed on the die attach area A so as for a semiconductor chip 26 to be mounted thereon, and the semiconductor chip 26 is electrically connected to the wire bonding pads 210 through a plurality of bonding wires 27, thereby forming a semiconductor package.

In another embodiment, the packaging substrate 3 further has a ground portion 31 formed on the substrate body 20 and the ground portion 21 is not connected to the circuit layer 21.

Therefore, since the conductive layer connects all the conductive traces, the present invention only needs a small number of electroplating lines to be connected to the conductive traces for performing the electroplating process, thereby effectively avoiding cross-talk.

Further, the present invention dispenses with the patterning processes in such as an NPL process, thereby greatly reducing the fabrication cost.

Furthermore, the recess can be used to prevent overflow of the adhesive material on the wire bonding pads to thereby ensure the wire bonding quality and the electrical reliability. Also, by forming the recess, the present invention eliminates the need to increase the distance between the wire bonding pads and the die attach area. As such, the packaging substrate can meet the miniaturization requirement.

In addition, since only a small number of electroplating lines are required in the present invention, the circuit layout space and flexibility are increased.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A fabrication method of a packaging substrate, comprising the steps of:

providing a substrate body having a die attach area and a circuit layer formed around the die attach area, wherein the circuit layer has a plurality of conductive traces each having a first end positioned adjacent to the die attach area and an apposing second end positioned away from the die attach area, each of the first ends has a wire bonding pad, the second end of at least one of the conductive traces at at least one side of the die attach area is connected to an electroplating line, and the electroplating lines and the wire bonding pads at the same side of the die attach area are different in number;

forming a conductive layer at an edge of the die attach area between the die attach area and the circuit layer, and electrically connecting the conductive layer to the conductive traces;

performing an electroplating process through the conductive layer and the electroplating line so as to form a surface treatment layer on the wire bonding pads; and removing the conductive layer.

2. The package of claim 1, wherein each of the wire bonding pads is connected to an extending line so as to be connected to the conductive layer.

3. The method of claim 1, wherein the conductive layer is removed by laser, a chemical solution or a scraper.

4. The method of claim 1, further comprising forming an adhesive layer on the die attach area such that a semiconductor chip is mounted on the die attach area through the adhesive layer and electrically connected to the wire bonding pads through a plurality of bonding wires.

5. The method of claim 1, further comprising forming a ground portion on the substrate body.

6. The method of claim 1, when removing the conductive layer, further comprising forming a recess corresponding in position to the conductive layer.

7. The method of claim 1, wherein the electroplating lines are less in number than the wire bonding pads at the same side of the die attach area.

8. The method of claim 7, wherein only one of the conductive traces is connected to the electroplating line through the second end thereof.

9. The package of claim 1, further comprising, after the formation of the conductive layer and before the formation of the surface treatment layer, forming on the substrate body and the circuit layer an insulating protection layer having a plurality of openings for exposing the wire bonding pads.

* * * * *